Nov. 26, 1968 J. L. BOYER 3,413,532

COMPRESSION BONDED SEMICONDUCTOR DEVICE

Original Filed Feb. 8, 1965 4 Sheets-Sheet 1

WITNESSES
Theodore F. Wrobel
James F. Young

INVENTOR
John L. Boyer
BY
Donald R. Lackey
ATTORNEY

Nov. 26, 1968 J. L. BOYER 3,413,532

COMPRESSION BONDED SEMICONDUCTOR DEVICE

Original Filed Feb. 8, 1965 4 Sheets-Sheet 2

United States Patent Office 3,413,532

Patented Nov. 26, 1968

3,413,532
COMPRESSION BONDED SEMICONDUCTOR DEVICE

John L. Boyer, El Segundo, Calif., assignor to Westinghouse Electric Corporation, Pittsburgh, Pa., a corporation of Pennsylvania Continuation of application Ser. No. 431,022, Feb. 8, 1965. This application Aug. 4, 1967, Ser. No. 662,260
6 Claims. (Cl. 317—235)

ABSTRACT OF THE DISCLOSURE

This invention provides a semiconductor device in which compression bonding is utilized to electrically connect a wafer of semiconductor material and electrical contacts with electrical leads. The compressive force is applied from outside of the device.

This application is a continuation of my application Ser. No. 431,022 filed Feb. 8, 1965 now abandoned.

*Background of the invention*

Semiconductor devices of the P-N junction type require that heat be removed from the semiconductor wafer, junction forming element, and contact or mounting element. It is important that the semiconductor wafer and contacting elements have as little contact resistance as possible, to keep heat produced to a minimum, and it is also important to remove the heat generated at the semiconductor wafer and contacting elements as quickly and efficiently as possible.

If the contact resistances at the semiconductor wafer could be reduced and the cooling efficiency improved it would be possible to carry a higher current with the same semiconductor wafer, or the amount of semiconductor material in the wafer could be reduced without reducing its current rating.

In addition to lowering the contact resistances at the semiconductor wafer and improving the cooling efficiency, it would also be desirable to provide semiconductor devices which have greater creepage distances without increasing their overall physical size, thus allowing them to operate at higher voltages.

Although a reduction in the contact resistances at the semiconductor wafer, improved cooling efficiency of the semiconductor wafer, and ability to withstand higher operating voltages are important characteristics, they must not be achieved at the expense of complicating the device structure and making the manufacture of the device more complex.

Accordingly, it is an object of this invention to provide a new and improved semiconductor device in which the contact resistances of the semiconductor wafer are reduced.

Another object of the invention is to provide a new and improved semiconductor device in which the cooling efficiency of the semiconductor wafer is improved.

A further object of the invention is to provide a new and improved semiconductor device which is capable of withstanding higher operating voltages without increasing the physical size of the device.

Another object of the invention is to provide a new and improved semiconductor device which has a rugged, uncomplicated structure which facilitates manufacture of the device.

*Summary of the invention*

The present invention accomplishes the above cited objects by providing a semiconductor device which eliminates the soldering of the semiconductor wafer and its associated elements to the remainder of the assembly, and eliminates internal and external flexible leads. The wafer and its associated elements are compression bonded to the remainder of the device between relatively large electrodes responsive to external pressure means. The electrodes act as heat sinks, and provide cooling on both sides of the semiconductor wafer. The electrodes are disposed outside of the encapsulated semiconductor wafer, thus eliminating internal leads and spring members. Since it is merely necessary to dispose the semiconductor wafer within the encapsulated housing, without the necessity of attaching leads thereto or pressing the wafer with internal spring members, or soldering the semiconductor wafer and its associated elements to the remainder of the device, a semiconductor device is provided which lends itself to uncomplicated, high production techniques. The diameter of one side of the compression joint is different from the diameter of the other side of the compression joint, to provide increased creepage distance on the semiconductor wafer, to aid in supporting a higher voltage, and the structure of the encapsulating enclosure provides increased creepage distances without increasing the physical size of the enclosure. The construction also allows a plurality of semiconductor devices each having one or more P-N junctions to be axially aligned and pressed with the same pressure means, with the semiconductor devices electrically connected as desired, to form series, parallel or series-parallel arrangements.

*Description of the preferred embodiments*

Figure 1:
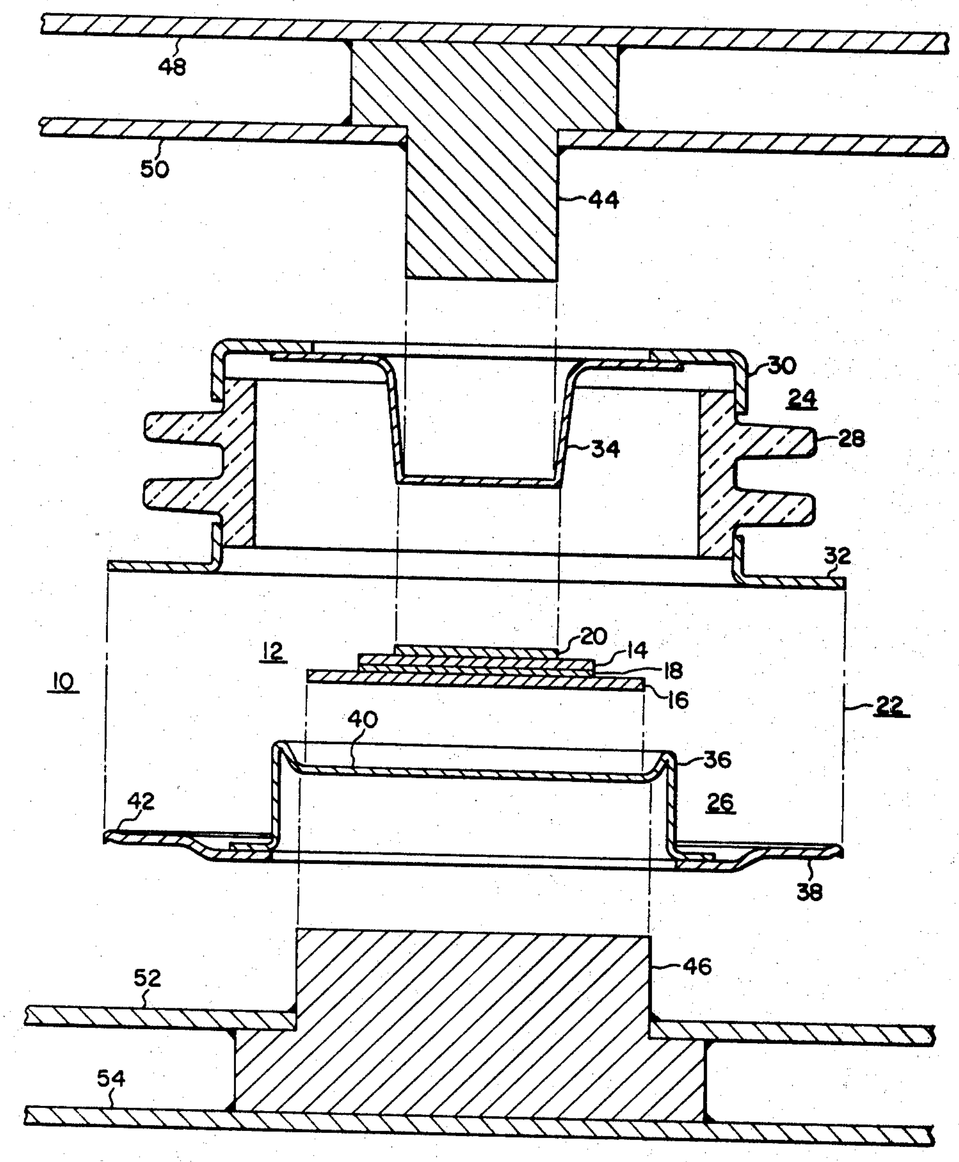
FIGURE 1 is an exploded, elevational view, in section, of a semiconductor device illustrating an embodiment of the invention.

Referring now to the drawings, and FIG. 1 in particular, there is shown an exploded, elevational view, in section, of a semiconductor device 10, constructed according to the teachings of this invention. More particularly, semiconductor device 10 may be a rectifier having a stacked junction assembly 12. Junction assembly 12 in general, comprises a wafer 14 of semiconductor material joined to a base or end contact 16 with suitable solder or brazing material 18. Junction forming material 20 is disposed on one side of wafer 14. The semiconductor wafer 14 may be formed of silicon, germanium, silicon carbide, or a stoichiometric compound comprised of elements from Group III and Group V of the Periodic Table. The remaining elements in the assembly 12 will depend upon which semiconductor material is employed, and upon whether the semiconductor material is of the P or N-type. P-type material is characterized by a deficiency of electrons in the crystal structure of the material, resulting in "holes" in the valence bonds between adjacent atoms, with conduction taking place by movement of the holes, which act like positive charges. N-type material is characterized by an excess of electrons, with conduction taking place because of the presence of these excess electrons. If semiconductor material has adjoining zones of N-type and P-type material, the junction between the zones has low impedance to current flow from the P-type to the N-type material, and high impedance to current flow from the N-type to the P-type material, thus possessing rectifier characteristics. For example, if the semiconductor wafer 14 is P-type silicon, the base 16 may be formed of molybdenum, tungsten or base alloys thereof, the solder 18 may be aluminum, and the junction forming material 20 may be gold-antimony alloy. If the wafer 14 is N-type silicon, the base 16 may be constructed of the same material as in the previous example, the solder 18 may be a gold-antimony alloy and the junction forming material 20 may be aluminum.

Assembly 12 may be formed separately, by preparing individual elements of the stack according to well known techniques, and heating the assembly to a predetermined temperature to provide the necessary fusion between the elements and produce at least one P-N junction. The upper support member joined to the junction forming material 20, commonly used in the prior art, is unnecessary in the construction of this device, thus eliminating a solder joint, and another source of heating.

Since the operation and life of semiconductor devices are adversely affected by the presence of impurities and moisture, the assembly 12 must be sealed within an enclosure to protect it. When the assembly 12 is sealed in an enclosure, means must be provided for making good electrical and thermal contact with the ends of the stacked assembly 12. In the prior art one end of the assembly is generally brazed to a heat sink, using hard or solt solder, and a flexible lead is generally brazed to the opposite end. These additional soldering steps cause considerable difficulty in the manufacture of semiconductor devices, and are a cause of a substantial percentage of rejects during manufacture. These solder joints also introduce considerable contact resistance into the assembly, producing heat when current flows therethrough, and also contributing to the failure of the device in service due to thermal fatigue of the solder. The introduction of flexible leads into the device is also a possible source of trouble, and adds to the manufacturing complexity of the device.

The construction of a semiconductor device as shown in FIG. 1 eliminates the steps of soldering the assembly 12 to adjacent contacts, and eliminates both internal and external flexible leads. Contact with the end elements, 16 and 20, of the stacked assembly 12 is made by compression bonding, which produces joints without solder, which have a lower contact resistance than solder joints. Excellent electrical and thermal joints, not subject to thermal fatigue, and having a low contact resistance, may be made between the ends of a stacked semiconductor assembly and its electrodes by disposing a relatively soft metal of high conductivity, such as silver, between the semiconductor assembly and its electrodes, and compressing the assembly with a predetermined pressure.

Referring again to FIG. 1, the stacked assembly 12 is disposed with an enclosure 22, which includes upper and lower portions 24 and 26, respectively. In the manufacture of the device 10, the stacked assembly 12, the upper portion 24 of enclosure 22, and lower portion 26 of enclosure 22 may all be preassembled, as shown, with the final assembly merely involving the joining together of the upper and lower portions, 24 and 26 respectively, of enclosure 22, with stacked junction assembly 12 disposed therein.

More specifically, upper portion 24 of enclosure 22 may include electrical insulating means 28 formed of zircon porcelain, or other suitable insulating material, and metallic flanged members 30 and 32, which are selected to have a coefficient of thermal expansion which substantially matches that of insulating means 28, and which may be joined to insulating means 28 by brazing, soldering, or other joining means. For example, members 30 and 32 may be formed of a copper plated alloy containing 10 to 35 percent by weight of cobalt, 22 to 33 percent by weight of nickel, and the balance being iron with incidental impurities, such alloy being well known by the trade name of Kovar. Metallic members 30 and 32 may be joined to insulating means 28 by silver solder, or other suitable brazing material. The portion 24 of enclosure 22 is completed by brazing a cup-like member 34 to member 30 with cup-like member 34 being formed of a relatively soft metal having a high thermal and electrical conductivity, such as silver. Cup-like member 34 will form one of the pressure contacts to junction assembly 12, and the bottom diameter of cup-like member 34 may be substantially the same as the diameter of the junction forming alloy 20.

The bottom portion 26 of enclosure 22 includes metallic cup-like member 36 which, like member 34, also forms one of the pressure contacts to assembly 12, and metallic member 38. Cup-like member 36 may also be formed of silver. Cup-like member 36 is joined to metallic member 38 by silver solder, or other suitable joining means. Cup member 36 may have a depressed portion 40 on the external portion of the bottom of the cup which has a diameter which will receive an aligned member 16 of stacked assembly 12. Metallic member 38 is formed of a material which may be readily joined to member 32 of portion 24. For example, member 38 may be formed of copper plated steel, and projection welded to member 32, with raised portion 42 of member 38 being a welding embossment.

The final assembly of semiconductor device 10 merely involves placing stacked assembly 12 in the depression 40 of lower portion 26, with member 16 of assembly 12 being disposed to contact the depression 40. The upper portion 24 of enclosure 22 is then placed over cup member 36 of lower portion 26, with members 32 and 38 being in contact. Members 32 and 38 are joined, such as by welding, to complete the assembly. The welding fixture may contain an inert atmosphere, such as dried nitrogen gas, so that when the enclosure 22 is completed and sealed, it will contain an inert dry atmosphere. Or, the enclosure 22 may contain a tip-off tube (not shown) which may be used to evacuate the enclosure 22 after assembly and to back-fill the enclosure with an inert atmosphere. A suitable dessicant may be disposed within the enclosure 22, if desired. Thus, enclosure 22 has two oppositely disposed cup-like members which create relatively large, oppositely disposed, external depressions in enclosure 22.

It will be noted from observing FIG. 1 that the flanged portions of members 30 and 32 engage insulaing member 28 on its external diameter rather than its internal diameter. This arrangement provides additional creepage distance across insulating member 28 and allows semiconductor device 10 to withstand a higher operating voltage without increasing the physical size of the device. It should also be noted that the diameter of member 16 is substantially larger than the diameter of member 20 in stacked assembly 12, with the diameters of the contacting cup members 34 and 36 being in the same relationship. This arrangement provides additional creepage distance across the assembly 12 from one end to the other, also allowing the semiconductor device 10 to withstand a higher voltage without increasing the physical size of the device.

The contacting cup-like members 34 and 36 which provide the pressure contacts to assembly 12 have the open portion of the cups facing outwardly, and the bottom portion of the cups extending inwardly to contact the end members 20 and 16 of semiconductor junction assembly 12. This allows relatively large electrode members 44 and 46 to extend into the openings provided by cup members 34 and 36 and provide the required pressure to produce high quality compression bonded joints between assembly 12, cups 34 and 36, and electrodes 44 and 46. Electrode members 44 and 46 may be formed of copper, or other suitable material having good electrical and thermal characteristics, and may be air cooled as shown in FIG. 1, with a plurality of fin members 48, 50, 52 and 54 being suitably attached to electrode members 44 and 46, such as by brazing. It will be understood, that electrodes 44 and 46 may also be liquid cooled if desired.

Thus, electrode members 44 and 46 may be made responsive to pressure means to place the bottoms of cup-like members 34 and 36 and assembly 12 under compression, forming excellent thermal and low resistance electrical joints between electrode 44 and the internal bottom portion of cup member 34, the external bottom portion of cup member 34 and junction forming material 20, the base member 16 and the external bottom portion of cup member 36, and the internal bottom portion of cup member 36 and electrode 46. The stacked assembly 12 is cooled from both sides, instead of from one side, providing rapid, efficient cooling of the semiconductor wafer, and the low resistance joints produced by compression bonding aids the cooling efficiency in producing less heat. Further, the elimination of several brazed joints extends the useful life of the device, as there are fewer solder joints to fail in fatigue, and assembly of the final device is also greatly facilitated.

Electrical connections (not shown) to the semiconductor device 10 may be accomplished by connection to electrode members 44 and 46, or to the fin members 48 and 50, 52 and 54, which electrically contact the electrode members 44 and 46.

In summary, FIG. 1 discloses a semiconductor device 10 which is easy to manufacture, assemble and seal, and which has a highly efficient cooling means which includes cooling the semiconductor wafer from both sides. The construction disclosed eliminates several solder joints by forming electrical and thermal connections to assembly 12 by compression bonding, eliminates internal and external flexible leads, accomplishes the compression bonding without springs or other pressure producing means within the sealed device enclosure 22, and provides increased creepage distances without increasing the physical size of the device. The increased creepage distances are obtained by making the contacting electrodes 44 and 46, cup-like members 34 and 36, and end members 20 and 16 of assembly 12 of two different diameters, and by joining the metallic members 30 and 32 of the enclosure 22 to the outer diameter of insulating member 28.

Figure 2:
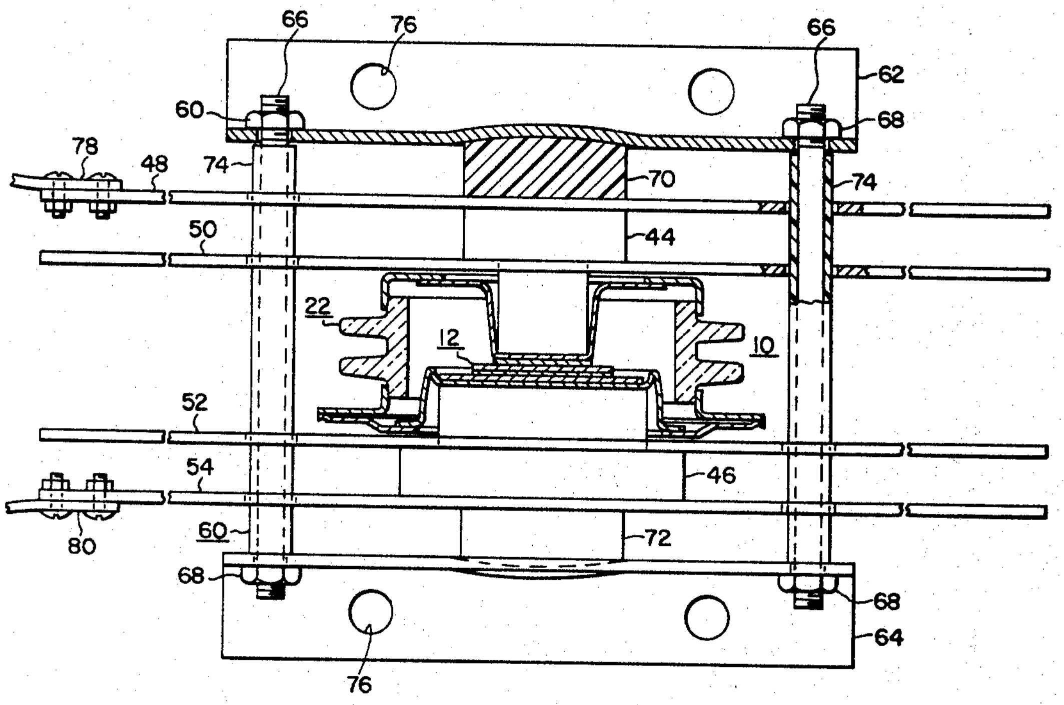
FIG. 2 is an elevational view, partially in section, of the semiconductor device illustrated in FIG. 1, showing pressure means what may be used.

The semiconductor device 10 shown in FIG. 1 is completed by applying pressure means to electrodes 44 and 46, in order to provide the desired compression bonded joints. Pressure means which may be utilized is shown in FIG. 2, which illustrates the semiconductor device 10 of FIG. 1 completely assembled and held with suitable pressure means 60. Pressure means 60 includes end members 62 and 64, formed of a strong hard material such as spring steel, and four spaced rod members 66, only two of which are visible in FIG. 2. Rod members 66 are threaded on each end, and nut members 68 are threadably engaged with the rod members 66 and tightened until the desired pressure is provided. Insulating members 70 and 72, formed of strong electrical insulating material such as the laminated plastics, are disposed between the electrodes 44 and 46 and the end members 62 and 64, to prevent end members 62 and 64 from being electrically connected with the device 10. Suitable insulating tubes 74 may be disposed around the rod members 66 to insulate them from the cooling fins 48, 50, 52 and 54. Opening 76 in the end members 62 and 64 may be used to physically mount the semiconductor device 10. Electrical connections 78 and 80 may be made to the cooling fins such as to fins 48 and 54, as shown in FIG. 2, or they may be made directly to the electrode members themselves.

Figure 3:
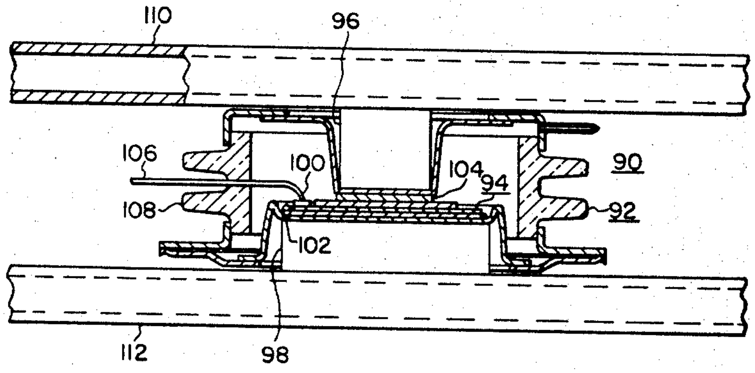
FIG. 3 is an elevational view, partially in section, of a semiconductor device illustrating another embodiment of the invention.

The construction disclosed in FIGS. 1 and 2 may also be applied to multi-junction, three terminal semiconductor devices, such as controlled rectifiers. FIG. 3 is an elevational view, partially in section, of a three terminal semiconductor device 90, having an enclosure 92, and electrodes 96 and 98, similar to those described in connection with FIG. 1. The stacked assembly 94 may contain a plurality of P-N junctions, prepared by well known techniques, such as taught in United States Patent 2,980,832, issued to Stein et al. on Apr. 18, 1961, and assigned to the same assignee as the present application. The basic differences between the devices shown in FIGS. 1 and 3 are the addition of a third terminal 100 to the device and the use of liquid cooling instead of air cooling for cooling the stacked semiconductor wafer assembly.

More specifically, the third terminal 100, which may be the gate or control electrode of the controlled rectifier, is made to the wafer of semiconductor material 102 in the semiconductor wafer assembly 94. The reduced diameter of the upper electrode 96 and junction forming material 104 greatly facilitate the addition of contact or control element 100 to the semiconductor wafer 102, as the contact or control element 100 may be made to the outer exposed edge of the semiconductor wafer 102. The lead 106 is joined to the control contact 100 and is disposed in sealed relation through the insulating member 108.

FIG. 3 illustrates another method of cooling semiconductor wafer assembly 94. Instead of brazing cooling fins to electrodes 96 and 98, as shown in FIGS. 1 and 2, duct members 110 and 112 may be brazed to electrodes 96 and 98, and a suitable coolant, such as water, passed therethrough. If the duct members 110 and 112 have sufficient wall thickness, pressure means may be applied to them and thus to the semiconductor wafer assembly 94. It will be understood, however, that coolant duct members 110 and 112 may be disposed through, or on the sides of electrodes 96 and 98, and pressure means applied to the oppositely disposed ends of the electrodes, as shown in FIG. 2.

Figure 4:
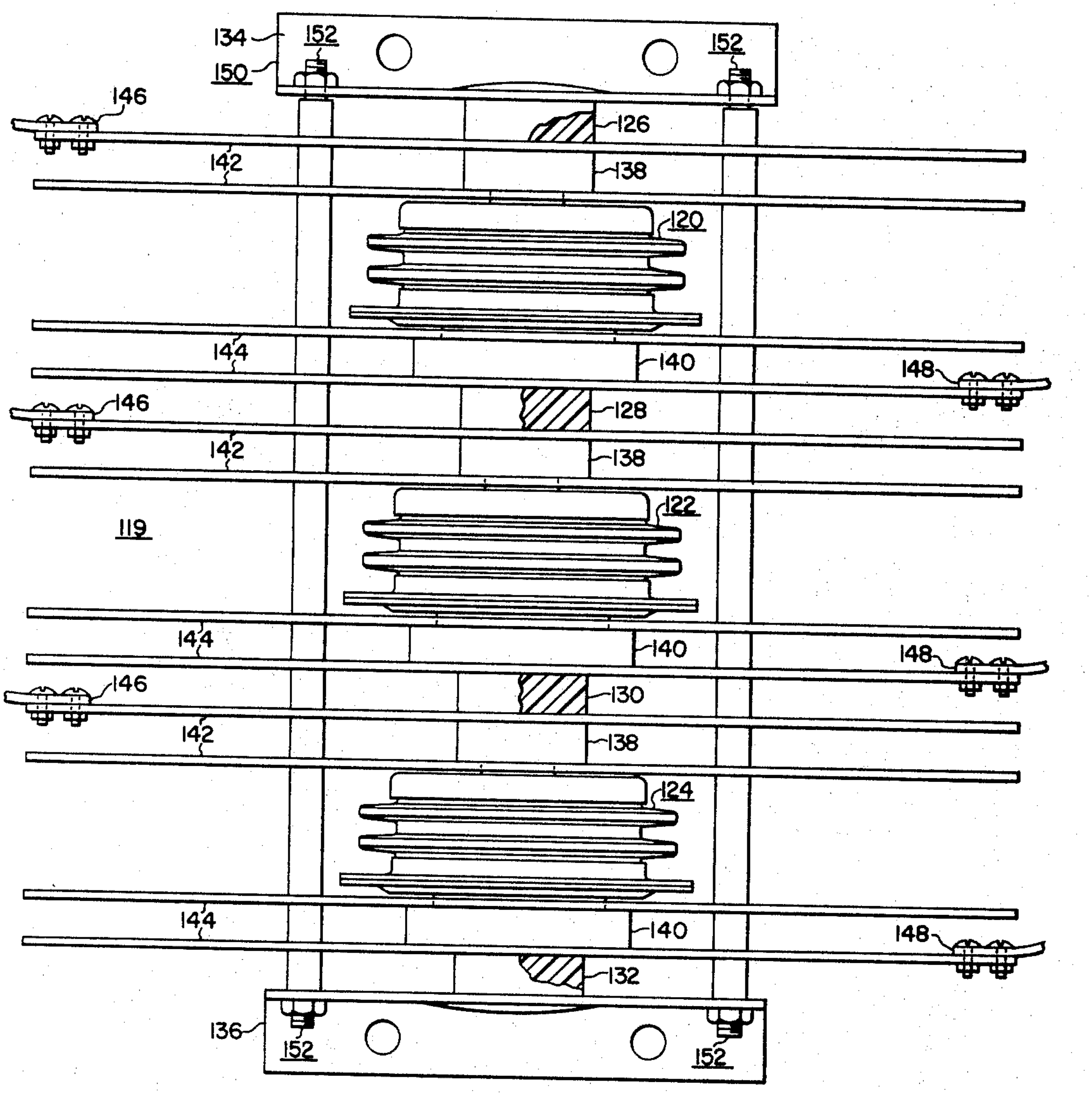
FIG. 4 is an elevational view, partially in section, illustrating how a plurality of semiconductor devices may be axially aligned, pressed with a common pressure means, and electrically connected as desired; and, FIG. 5 is an elevational view, partially in section, illustrating a plurality of semiconductor devices axially aligned, pressed with common pressure means, and electrically connected in series.

The construction of semiconductor devices shown in FIGS. 1, 2 and 3 has many advantages, other than those already enumerated. For example, the construction of the device makes it practical to stack a plurality of devices end-to-end, axially aligned, and utilize a common pressure means to provide the necessary axial pressure for all of the devices. FIG. 4 illustrates such an arrangement whereby a compact structure or assembly 119 is formed which utilizes three semiconductor devices 120, 122 and 124, with each device being constructed as shown in FIGS. 1, 2 and 3. Semiconductor devices 120, 122 and 124 are axially aligned, with insulating members 126, 128, 130 and 132 electrically separating the devices 120, 122 and 124 from one another and from end members 134 and 136. Each semiconductor device 120, 122 and 124 has an upper electrode 138 and a lower electrode 140. Each device also has cooling fins 142 attached to electrode 138 and cooling fins 144 attached to electrode 140. It will be understood that more or less cooling fins may be used, or that electrodes 138 and 140 may be liquid cooled, as hereinbefore described. Each device also has an electrical lead 146 attached to electrode 138 and an electrical lead 148 attached to electrode 140. The electrical leads 146 and 148 may be attached directly to the electrodes 138 and 140, or to the appropriate cooling fins 142 and 144, as shown. Pressure means 150 may include end members 134 and 136 and four rod-nut combinations 152, as hereinbefore described. It will be understood that many different pressure means 150 may be utilized. For example, in order to more evenly apply the pressure to each semiconductor device 120, 122 and 124, a ball bearing (not shown) may be employed at each end of members 134 and 136 to transmit the force from the pressure means 150 equally to each device. The ball bearing will automatically provide alignment of the pressure throughout the entire stacked assembly.

Electrical connections may be made as desired to the assembly 119, to provide a series arrangement, or a parallel arrangement. Series-parallel arrangements may also be employed. If a series arrangement is desired, the electrical leads 146 and 148 adjacent to one another would be connected together. If a parallel arrangement is desired, all the leads referenced with numeral 146 would be connected together, and all of the leads referenced with numeral 148 would be connected together. This arrangement provides a compact assembly which saves cost and cubicle space.

Figure 5:
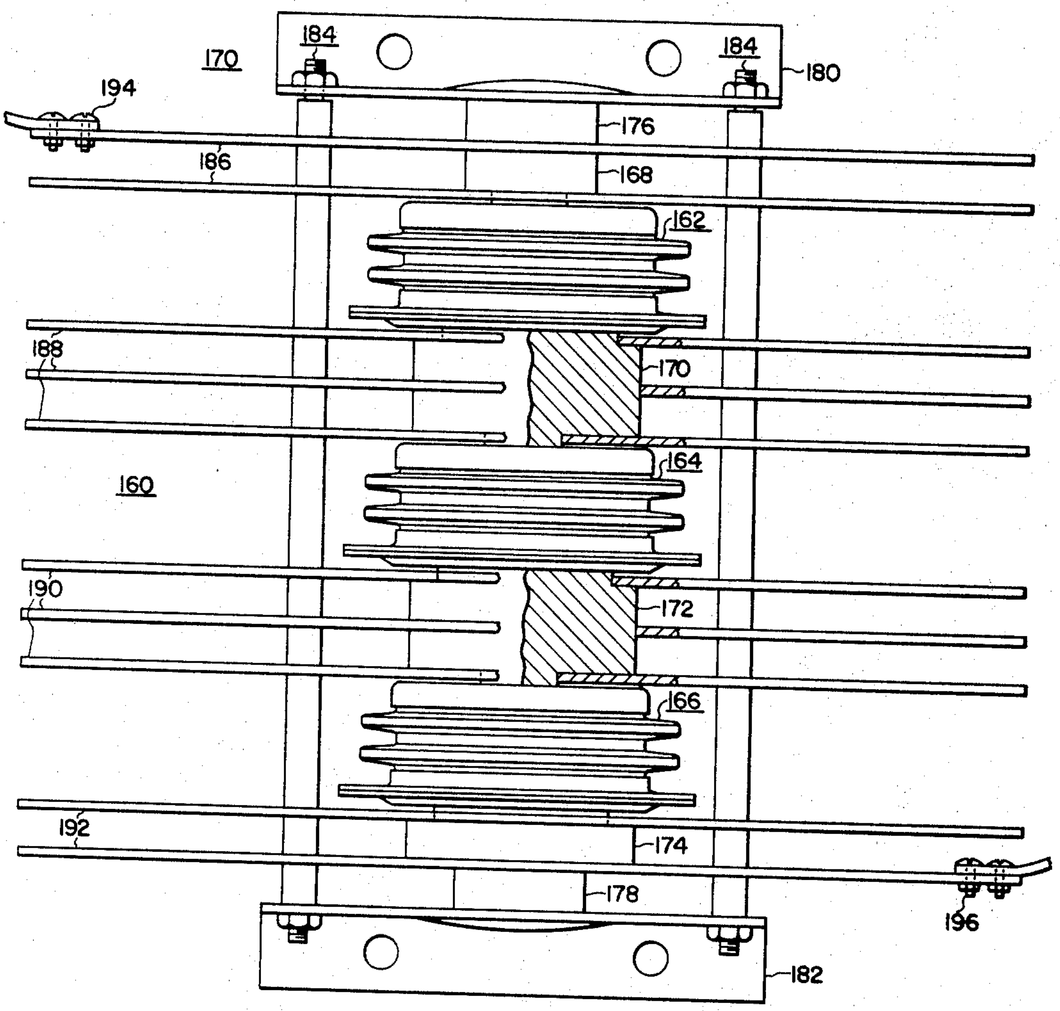

If it is known in advance that the assembly 119 is to have all of its semiconductor devices 120, 122 and 124 connected in series circuit relation, the assembly 119 may be simplified, and made smaller, as shown in FIG. 5. FIG. 5 illustrates an assembly 160 having three semiconductor devices 162, 164 and 166, axially aligned and held with a common pressure means 170. Each device 162, 164 and 166 has upper and lower electrodes, with the same electrode serving as the upper and lower electrode between the devices. For example, device 162 has upper electrode 168 and lower electrode 170. Lower electrode 170 of device 162 serves as the upper electrode for device 164, and device 164 has a lower electrode 172. Lower electrode 172 of device 164 serves as the upper electrode for device 166, and device 166 also has a lower electrode 174. Insulating members 176 and 178 electrically separate the series connected devices 162, 164 and 166 from end members 180 and 182. Four rod and nut combination 184 cooperate with the end members 180 and 182 to provide the pressure required for semiconductor devices 162, 164 and 166. Cooling fin members 186 serve electrodes 168, cooling fin members 188 serve electrode members 170, cooling fin members 190 serve electrode members 172, and cooling fin members 192 serve electrode members 174. In this arrangement only two electrical leads, 194 and 196, are required, and they may be connected to electrodes 168 and 178, respectively, through cooling fins 186 and 192.

The semiconductor device construction and arrangement disclosed herein has many advantages. The semiconductor junction is cooled from both sides, greatly improving the cooling efficiency of the device, allowing it to conduct higher current without increasing the size of the semiconductor wafer. The semiconductor assembly is not soldered to its external terminals, but is connected to them by a pressure bond which not only eliminates solder, but internal and external flexible leads as well. Electrical and thermal contact is facilitated by the pressure contacts, increasing heat conduction and cooling efficiency, and producing less heat at the joint during current flow, due to lower electrical resistance at the joints. This also adds to the current rating of the device, or allows the junction seize to be reduced without reducing its current rating. The fact that internal and external flexible leads are eliminated makes this construction particularly useful in rotating rectifier applications, where the semiconductor devices are physically rotated, as there are no leads to flex and break from fatigue.

The sealed enclosure construction is very easy to manufacture, and final assembly is particularly facilitated. The junction or semiconductor wafer assembly is merely placed in the lower portion of the enclosure which has a holding and locating cup, the top portion of the assembly is disposed over it and welded to the lower portion of the enclosure. Since the junction assembly depends upon its electrical and thermal contact through pressure alone, manufacturing tolerances on the thickness of the semiconductor wafer assembly, and many other manufacturing tolerances as well, may be comparatively large without affecting the quality or life of the device. The construction of the device also lends itself to high voltage devices, as the semiconductor assembly has increased creepage distances, and the enclosure has increased creepage distances, making it possible to provide a device that will withstand higher operating voltages without physically increasing the size of the device.

The fact that the semiconductor assembly is not soldered into the device eliminates these manufacturing steps, which are not only costly in themselves, but also cause many rejects. Also, the assembly may be made with only one end contact instead of the conventional two end contacts eliminating another manufacturing step as well as a soldered joint.

The pressure is applied to the assembly external to the sealed enclosure, to obtain the desired pressure bonded joints, eliminating internal springs and leads.

The device construction makes it possible to axially align and stack semiconductor devices of both forward and reverse polarities in the same stack and interconnect them in any desired electrical arrangement with a minimum number of electrical connections, a minimum length of electrical connections, and in a minimum of physical space. Also, the same pressure means may be utilized for the entire stack of axially aligned devices, resulting in still larger cost savings. When the devices are to be connected in series circuit relation, a still smaller, more compact, simpler arrangement may be used.

While the stacked device assemblies of FIGS. 4 and 5 were illustrated with three semiconductor devices, it will be understood that the same principles will apply to an assembly of any desired number of devices.

Since numerous changes may be made in the above described apparatus and different embodiments of the invention may be made without departing from the spirit thereof, it is intended that all matter contained in the foregoing description or shown in the accompanying drawings shall be interpreted as illustrative and not in a limiting sense.

I claim as my invention:

1. A compression bonded semiconductor device comprising, a semiconductor assembly comprising a flat semiconductor wafer having regions of different type conductivity, a bottom electrode having an area at least as large as the bottom surface of the semiconductor wafer joined to the bottom surface of the flat semiconductor wafer, a top electrode smaller in area than the semiconductor wafer joined to the top surface of the flat semiconductor wafer and with the periphery of the top electrode being within and spaced from the periphery of the wafer, a first cup-like member having a central portion projecting upwardly and provided with an upper peripheral lip to form a slightly depressed flat central portion receiving and locating the bottom electrode of the semiconductor assembly, a peripheral flange on the lower end of said first cup-like member, a second cup-like member having a peripheral flange and having a downwardly projecting central portion without any lip terminating in a flat face smaller than and substantially parallel to the flat central portion of the first cup-like member, the downwardly projecting central portion at and adjacent the flat face being substantially of the same area and coextensive with the top electrode of the semiconductor assembly, the peripheral flange of the first and second cup-like members each being joined to metal flange members, a cylindrical insulator having corrugations on its external surface surrounding the semiconductor assembly and the upwardly and downwardly projecting portions of the first and second cup-like members, the metal flange members being spaced from the top and bottom edges of the cylindrical insulator and being joined only to the exterior surface of the cylindrical insulator, the metal flanges, insulator and the cup-like members being joined to provide a hermetically sealed enclosure for the semiconductor assembly, the projecting portions of the two cup-like members being resiliently movable toward one another, the semiconductor assembly being unbonded but located and held by the upwardly and downwardly extending projecting portions of the first and second cup-like members, first and second external electrodes, said first and second external electrodes having projections which fit within the central projecting portions of said first and second cup-like members, compressive means for compressing the external electrodes into a good electrically and thermally conductive contact with the flat portions of said first and second cup-like members, which flat portions are resiliently compressed into a good electrically and thermally conductive contact with the top and bottom electrodes affixed to the semiconductor wafer, and large area cooling means affixed to the external electrodes.

2. The device of claim 1 in which a third electrical electrode is made to said semiconductor wafer, said third electrical contact being electrically insulated from said first and second cup-like members, and an electrical lead connected to said third contact, said lead extending from said semiconductor assembly to the exterior to form a third terminal for said semiconductor device.

3. The device of claim 2 in which the third electrical contact is affixed to the exposed portion of the top surface of said semiconductor wafer between the top electrode and the periphery of the semiconductor wafer.

4. The device of claim 2 in which the lead projects through the cylindrical insulator between the corrugations.

5. A semiconductor assembly comprising a plurality of axially aligned semiconductor devices of claim 1, and a single compression means holding the devices in axial alignment as well as compressing the cup-like members of each device into thermal and electrical contact with the top and bottom electrodes of the semiconductor assembly.

6. A semiconductor assembly comprising a plurality of axially aligned semiconductor devices of claim 1, each of said devices being electrically insulated from the others and a single compression means holding the devices in axial alignment.

References Cited

UNITED STATES PATENTS

| | | | |
|---|---|---|---|
| 2,933,662 | 4/1960 | Boyer et al. | 317—234 |
| 3,170,098 | 2/1965 | Marino | 317—234 |
| 3,179,860 | 4/1965 | Clark et al. | 317—234 |
| 3,234,437 | 2/1966 | Dumas | 317—234 |
| 3,274,458 | 9/1966 | Boyer et al. | 317—234 |
| 3,280,389 | 10/1966 | Martin | 317—234 |
| 3,293,508 | 12/1966 | Boyer | 317—234 |

JOHN W. HUCKERT, *Primary Examiner.*

J. R. SHEWMAKER, *Assistant Examiner.*